(12) United States Patent
Son

(10) Patent No.: US 9,640,784 B2
(45) Date of Patent: May 2, 2017

(54) DEPOSITION APPARATUS, METHOD OF MANUFACTURING ORGANIC LIGHT EMITTING DISPLAY APPARATUS USING THE SAME, AND ORGANIC LIGHT EMITTING DISPLAY APPARATUS MANUFACTURED BY USING THE METHOD

(71) Applicant: Samsung Display Co., Ltd., Yongin, Gyeonggi-Do (KR)

(72) Inventor: Jin-Seok Son, Yongin (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 200 days.

(21) Appl. No.: 14/195,013

(22) Filed: Mar. 3, 2014

(65) Prior Publication Data

US 2015/0044803 A1 Feb. 12, 2015

(30) Foreign Application Priority Data

Aug. 9, 2013 (KR) ........................ 10-2013-0094887

(51) Int. Cl.
*B05D 5/12* (2006.01)
*H01L 51/56* (2006.01)
*C23C 14/24* (2006.01)
*C23C 14/04* (2006.01)
*C23C 14/56* (2006.01)
*H01L 51/00* (2006.01)

(52) U.S. Cl.
CPC ............ *H01L 51/56* (2013.01); *C23C 14/042* (2013.01); *C23C 14/24* (2013.01); *C23C 14/564* (2013.01); *C23C 14/568* (2013.01); *H01L 51/001* (2013.01)

(58) Field of Classification Search
USPC .......................................... 427/66
See application file for complete search history.

(56) References Cited

U.S. PATENT DOCUMENTS

2006/0174829 A1 8/2006 An et al.
2006/0240669 A1* 10/2006 Kaneko ................. C23C 14/042
                                                        438/680
2007/0178708 A1* 8/2007 Ukigaya ............... C23C 14/044
                                                        438/758

(Continued)

FOREIGN PATENT DOCUMENTS

KR 1020060097185 A 9/2006
KR 1020070045527 A 5/2007

(Continued)

*Primary Examiner* — Austin Murata
(74) *Attorney, Agent, or Firm* — Cantor Colburn LLP

(57) ABSTRACT

A deposition apparatus includes a substrate combining unit configured to dispose a substrate on a moving unit including a surface, a first blocking member combining unit configured to raise a first blocking member, a first deposition unit including one or more deposition assemblies configured to deposit a material on the substrate, a first blocking member separation unit configured to separate the first blocking member downward from the moving unit, and a first conveyer unit configured to convey the moving unit in a first direction, where the one or more deposition assemblies are spaced apart from the substrate by a predetermined distance so that the material is deposited on the substrate in the first deposition unit while the moving unit is conveyed in the first direction.

11 Claims, 6 Drawing Sheets

(56) References Cited

U.S. PATENT DOCUMENTS

| | | | |
|---|---|---|---|
| 2009/0269492 A1* | 10/2009 | No | C23C 14/042 427/255.6 |
| 2012/0103253 A1* | 5/2012 | Park | C23C 14/042 118/301 |
| 2012/0103254 A1 | 5/2012 | Sushihara | |

FOREIGN PATENT DOCUMENTS

| | | |
|---|---|---|
| KR | 1020120046689 A | 5/2012 |
| KR | 1020120105837 A | 9/2012 |

\* cited by examiner

DEPOSITION APPARATUS, METHOD OF MANUFACTURING ORGANIC LIGHT EMITTING DISPLAY APPARATUS USING THE SAME, AND ORGANIC LIGHT EMITTING DISPLAY APPARATUS MANUFACTURED BY USING THE METHOD

This application claims the benefit of Korean Patent Application No. 10-2013-0094887, filed on Aug. 9, 2013, and all the benefits accruing therefrom under 35 U.S.C. §119, the disclosure of which is incorporated herein in its entirety by reference.

BACKGROUND

1. Field

One or more exemplary embodiments of the invention relate to a deposition apparatus, a method of manufacturing an organic light emitting display apparatus by using the deposition apparatus, and an organic light emitting display apparatus manufactured by using the method, and more particularly, to a deposition apparatus capable of effectively preventing contamination in a deposition process, a method of manufacturing an organic light emitting display apparatus by using the deposition apparatus, and an organic light emitting display apparatus manufactured by using the method.

2. Description of the Related Art

Organic light-emitting display devices have wider viewing angles, better contrast characteristics, and faster response speeds than other display devices, and thus have drawn attention as next-generation display devices.

An organic light-emitting display device generally includes intermediate layers that include an emission layer and are disposed between a first electrode and a second electrode facing each other. The first and second electrodes and the intermediate layers may be formed using any one of various methods, such as a deposition method. In an exemplary embodiment, in the deposition method, a fine metal mask ("FMM") in which is defined openings of a pattern that is the same as or similar to that of an intermediate layer to be formed is disposed to closely contact a substrate on which the intermediate layer and the like are formed, and a material is deposited on the FMM to form the intermediate layer having a desired pattern.

SUMMARY

In a deposition method using a fine metal mask ("FMM"), a large FMM has to be used when manufacturing a large organic light-emitting display device including a large substrate or when simultaneously manufacturing a plurality of organic light emitting display devices by using a large mother-substrate. In this case, when such a large mask is used, the mask may bend due to self-gravity, and this may make it impossible to form an intermediate layer having a previously set and accurate pattern. Moreover, processes of aligning a substrate and an FMM to closely contact each other, performing deposition thereon, and separating the FMM from the substrate are time-consuming, resulting in a long manufacturing time and low production efficiency.

One or more exemplary embodiments of the invention include a deposition apparatus capable of effectively preventing contamination in a deposition process.

One or more exemplary embodiments of the invention include a method of manufacturing an organic light emitting display apparatus by using the deposition apparatus.

One or more exemplary embodiments of the invention include an organic light emitting display apparatus manufactured by using the method.

Additional exemplary embodiments will be set forth in part in the description which follows and, in part, will be apparent from the description, or may be learned by practice of the exemplary embodiments.

According to one or more exemplary embodiments of the invention, a deposition apparatus includes a substrate combining unit configured to dispose a substrate on a moving unit including a surface, on which the substrate is fixed while the surface faces upward, a first blocking member combining unit configured to raise a first blocking member to combine the first blocking member with the moving unit including the substrate fixed thereon, the moving unit being in a state in which the surface, on which the substrate is fixed, faces downward, wherein the first blocking member exposes a portion of the substrate on which deposition is to be performed, a first deposition unit including one or more deposition assemblies configured to deposit a material on the substrate in a state in which the first blocking member is combined with the moving unit including the substrate fixed thereon, a first blocking member separation unit configured to separate the first blocking member downward from the moving unit including the substrate fixed thereon, the moving unit being in the state in which the surface, on which the substrate is fixed, faces downward, and a first conveyer unit configured to convey the moving unit including the substrate fixed thereon in a first direction so that the moving unit including the substrate fixed thereon is conveyed from the substrate combining unit to the first blocking member separation unit sequentially through the first blocking member combining unit and the first deposition unit, wherein the one or more deposition assemblies are spaced apart from the substrate by a predetermined distance so that the material is deposited on the substrate in the first deposition unit while the moving unit is conveyed in the first direction.

In an exemplary embodiment, the substrate combining unit is configured to flip the moving unit so that the surface, on which the substrate is fixed, faces downward after the substrate is disposed on the moving unit.

In an exemplary embodiment, the deposition apparatus may further include a substrate separation unit configured to separate the substrate from the moving unit including the substrate fixed thereon, which is conveyed from the first blocking member separation unit.

In an exemplary embodiment, the moving unit that is conveyed to the substrate separation unit may be conveyed in the state in which the surface, on which the substrate is fixed, faces downward, and the substrate separation unit may be configured to flip the moving unit so that the surface, on which the substrate is fixed, faces upward, before separating the substrate from the moving unit.

In an exemplary embodiment, the deposition apparatus may further include a second conveyer unit that returns the moving unit to the substrate combining unit after the substrate is separated from the moving unit by the substrate separation unit.

In an exemplary embodiment, the second conveyer unit may be disposed above the first conveyer unit.

In an exemplary embodiment, the deposition apparatus may further include a first blocking member conveyer unit that returns the first blocking member separated by the first blocking member separation unit to the first blocking member combining unit.

In an exemplary embodiment, the first blocking member conveyer unit may be disposed below the first conveyer unit.

In an exemplary embodiment, the first blocking member separation unit may include a first blocking member rotation unit configured to rotate the separated first blocking member in a first rotation direction by a previously set angle by using the first direction as an axis of rotation.

In an exemplary embodiment, the first blocking member rotation unit may be configured to rotate the separated first blocking member by an angle of about 90 degrees.

In an exemplary embodiment, the first blocking member conveyer unit may be configured to return the separated first blocking member so that the separated first blocking member passes by the first deposition unit.

In an exemplary embodiment, the first blocking member combining unit may include a first blocking member re-rotation unit configured to rotate the first blocking member returned by the first blocking member conveyer unit in a second rotation direction, which is opposite to the first rotation direction, by the previously set angle by using the first direction as the axis of rotation.

In an exemplary embodiment, each of the one or more deposition assemblies may include a deposition source configured to discharge a deposition material, a deposition source nozzle unit that is disposed in the direction of the first conveyer unit of the deposition source and includes a deposition source nozzle, and a patterning slit sheet that is disposed to face the deposition source nozzle unit and in which a plurality of patterning slits is defined in one direction.

In an exemplary embodiment, the deposition apparatus may further include a second blocking member combining unit configured to raise a second blocking member and combine the second blocking member with the moving unit including the substrate fixed thereon, the moving unit being in the state in which the surface on which the substrate is fixed, faces downward, wherein the second blocking member exposes a portion of the substrate on which deposition is to be performed, a second deposition unit including one or more deposition assemblies configured to deposit a material on the substrate in a state in which the second blocking member is combined with the moving unit including the substrate fixed thereon, and a second blocking member separation unit configured to separate the second blocking member downward from the moving unit including the substrate fixed thereon, the moving unit being in a state in which the surface, on which the substrate is fixed, faces downward, wherein the first conveyer unit is configured to convey the moving unit including the substrate fixed thereon in the first direction so that the moving unit including the substrate fixed thereon is conveyed from the first blocking member separation unit to the second blocking member separation unit through the second blocking member combining unit and the second deposition unit sequentially, and wherein the one or more deposition assemblies of the second deposition unit is spaced apart from the substrate by a predetermined distance so that the material is deposited on the substrate in the second deposition unit while the moving unit is conveyed in the first direction.

In an exemplary embodiment, the deposition apparatus may further include a substrate separation unit configured to separate the substrate from the moving unit including the substrate fixed thereon, which is conveyed from the second blocking member separation unit.

In an exemplary embodiment, the moving unit that is conveyed to the substrate separation unit may be conveyed in a state in which the surface, on which the substrate is fixed, faces downward, and the substrate separation unit may be configured to flip the moving unit so that the surface, on which the substrate is fixed, faces upward, before separating the substrate from the moving unit.

In an exemplary embodiment, the deposition apparatus may further include a second conveyer unit configured to return the moving unit to the substrate combining unit after the substrate is separated from the moving unit by the substrate separation unit.

In an exemplary embodiment, the second conveyer unit may be disposed above the first conveyer unit.

The deposition apparatus may further include a first blocking member conveyer unit configured to return the first blocking member separated by the first blocking member separation unit to the first blocking member combining unit, and a second blocking member conveyer unit configured to return the second blocking member separated by the second blocking member separation unit to the second blocking member combining unit.

In an exemplary embodiment, the first blocking member conveyer unit and the second blocking member conveyer unit may be disposed below the first conveyer unit.

According to one or more exemplary embodiments of the invention, a method of manufacturing an organic light emitting display apparatus includes placing a substrate on a moving unit including a surface, on which the substrate is fixed, facing upward, flipping the moving unit including the substrate fixed thereon so that the surface, on which the substrate is fixed, faces downward, raising a first blocking member to combine the first blocking member with the moving unit including the substrate fixed thereon, the moving unit being in the state in which the surface, on which the substrate is fixed, faces downward, so that the first blocking member exposes a portion of the substrate on which deposition is to be performed, forming a layer by depositing a deposition material discharged from a deposition assembly on the substrate while relatively conveying the moving unit including the substrate fixed thereon with respect to the deposition assembly in the state in which the deposition assembly and the substrate are spaced apart from each other by a predetermined distance, and separating the first blocking member downward from the moving unit including the substrate fixed thereon, the moving unit being in the state in which the surface, on which the substrate is fixed, faces downward.

In an exemplary embodiment, the method may further include separating the substrate from the moving unit including the substrate fixed thereon after the separating the first blocking member.

In an exemplary embodiment, the method may further include flipping the moving unit including the substrate fixed thereon so that the surface, on which the substrate is fixed, faces upward, before the separating the substrate from the moving unit.

In an exemplary embodiment, the method may further include returning the moving unit to dispose a new substrate on the moving unit after the separating the substrate from the moving unit.

In an exemplary embodiment, the returning the moving unit may include returning the moving unit at a height that is greater than a height of conveying the moving unit including the substrate fixed thereon in the forming the layer.

In an exemplary embodiment, the method may further include returning the separated first blocking member to recombine the separated first blocking member with the moving unit including a new substrate fixed thereon.

In an exemplary embodiment, the returning the separated first blocking member may include returning the first blocking member at a height that is lower than the height of conveying the moving unit including the substrate fixed thereon in the forming the layer.

In an exemplary embodiment, the method may further include rotating the separated first blocking member in a first rotation direction by a previously set angle by using a first direction as an axis of rotation, wherein the returning the separated first blocking member includes returning the separated first blocking member in a state in which the first blocking member is rotated in the first rotation direction.

In an exemplary embodiment, the rotating the separated first blocking member may include rotating the separated first blocking member by an angle of about 90 degrees.

In an exemplary embodiment, the method may further include raising a second blocking member to combine the second blocking member with the moving unit including the substrate fixed thereon, the moving unit being in the state in which the surface, on which the substrate is fixed, faces downward, so that the second blocking member exposes a portion of the substrate on which deposition is to be performed, forming a layer by depositing a deposition material discharged from a deposition assembly on the substrate while relatively conveying the moving unit including the substrate fixed thereon in a first direction with respect to the deposition assembly in the state in which the deposition assembly and the substrate are spaced apart from each other by a predetermined distance, and separating the second blocking member downward from the moving unit including the substrate fixed thereon, the moving unit being in the state in which the surface, on which the substrate is fixed, faces downward.

In an exemplary embodiment, the method may further include separating the substrate from the moving unit including the substrate fixed thereon after the separating the second blocking member.

In an exemplary embodiment, the method may further include flipping the moving unit including the substrate fixed thereon so that the surface, on which the substrate is fixed, faces upward, before the separating the substrate from the moving unit.

In an exemplary embodiment, the method may further include returning the moving unit to dispose a new substrate on the moving unit after the separating the substrate from the moving unit.

In an exemplary embodiment, the returning the moving unit may include returning the moving unit at a height that is greater than a height of conveying the moving unit including the substrate fixed thereon in the forming the layer.

In an exemplary embodiment, the method may further include returning the separated first blocking member to recombine the separated first blocking member with the moving unit including a new substrate fixed thereon, and returning the separated second blocking member to recombine the separated second blocking member with the moving unit including a new substrate fixed thereon.

In an exemplary embodiment, the returning the first blocking member may include returning the first blocking member at a height that is lower than the height when conveying the moving unit including the substrate fixed thereon in the forming the layer, and the returning the second blocking member may include returning the second blocking member at a height that is lower than the height of conveying the moving unit including the substrate fixed thereon in the forming the layer.

According to one or more exemplary embodiments of the invention, an organic light emitting display apparatus includes a substrate, a plurality of thin film transistors ("TFTs") disposed on the substrate, a plurality of pixel electrodes electrically connected to the plurality of TFTs, a plurality of deposition layers disposed on the plurality of pixel electrodes, and an opposite electrode disposed on the plurality of deposition layers, wherein at least one of the plurality of deposition layers is a linear pattern provided by using the deposition apparatus.

BRIEF DESCRIPTION OF THE DRAWINGS

These and/or other exemplary embodiments will become apparent and more readily appreciated from the following description of the exemplary embodiments, taken in conjunction with the accompanying drawings of which.

DETAILED DESCRIPTION

Figure 1:
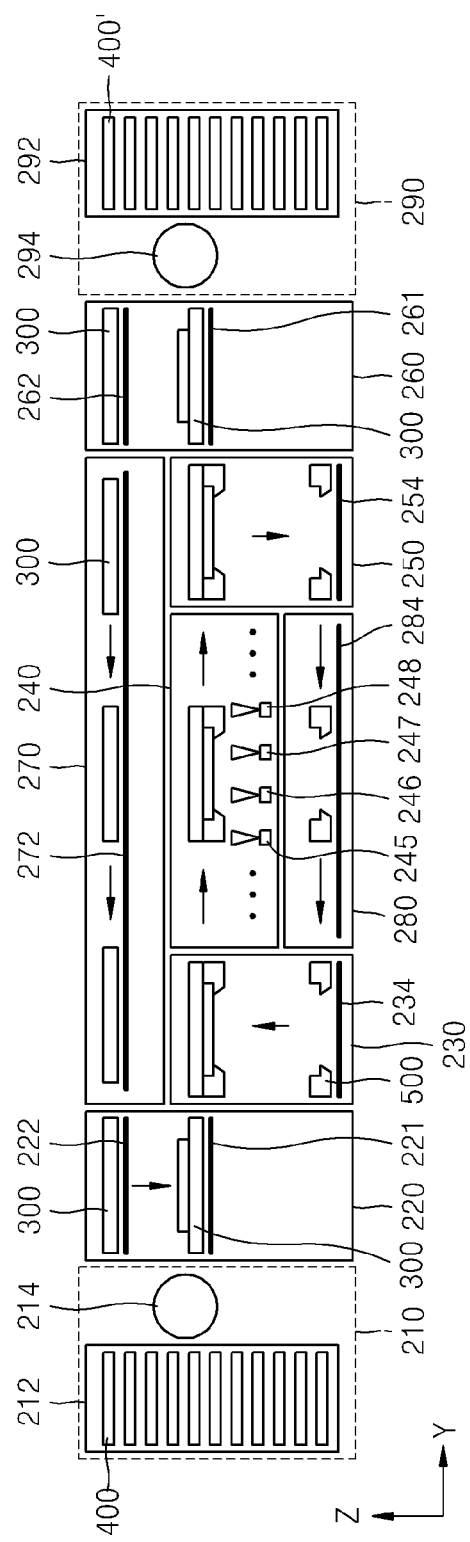
FIG. 1 is a schematic conceptual side view illustrating an exemplary embodiment of a deposition apparatus according to the invention.

Reference will now be made in detail to exemplary embodiments, exemplary embodiments of which are illustrated in the accompanying drawings, wherein like reference numerals refer to like elements throughout. In this regard, the exemplary embodiments may have different forms and should not be construed as being limited to the descriptions set forth herein. Accordingly, the exemplary embodiments are merely described below, by referring to the figures, to explain exemplary embodiments of the description. In the drawings, for convenience of description, sizes of elements may be exaggerated or reduced. In an exemplary embodiment, as sizes and thicknesses of elements illustrated in the drawings are provided arbitrarily, the invention is not limited to the illustrated drawings.

Also, meanings of an x-axis, a y-axis, and a z-axis are not limited to three axes on an orthogonal coordinates system, but may be wider. In an exemplary embodiment, the x-, y-, and z-axes may cross each other at right angles, but may alternatively denote other directions that do not cross each other at right angles.

It will also be understood that when a component, such as a layer, a film, a region, or a plate, is referred to as being "on" another component, it can be directly on the other component, or an intervening component may also be present.

As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Expressions such as "at least one of," when preceding a list of elements, modify the entire list of elements and do not modify the individual elements of the list. The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized exemplary embodiments. As such, variations from the shapes of the illustrations as a result, for example, of manufacturing techniques and/or tolerances, are to be expected. Thus, exemplary embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a schematic conceptual side view illustrating a deposition apparatus according to an exemplary embodiment of the invention.

Referring to FIG. 1, the deposition apparatus according to the illustrated exemplary embodiment of the invention includes a substrate combining unit 220, a first blocking member combining unit 230, a first deposition unit 240, a first blocking member separation unit 250, and a conveyer unit 221. As illustrated in FIG. 1, the deposition apparatus may further include a loading unit 210, a substrate separation unit 260, a moving and returning unit 270, a first blocking member returning unit 280, and an unloading unit 290, when necessary.

The loading unit 210 may include a first rack 212 and a transport robot 214. A plurality of substrates 400 onto which a deposition material has not yet been applied are stacked up on the first rack 212. The transport robot 214 picks up one of the substrates 400 from the first rack 212, and the picked-up substrate 400 is returned by the moving and returning unit 270 and is disposed on a moving unit 300 disposed in the substrate combining unit 220. In exemplary embodiments, the substrate 400 may be fixed on an electrostatic chuck included in the moving unit 300 by using an electrostatic force or may be fixed on the moving unit 300 by using a clamp or the like. In an exemplary embodiment, the substrate 400 may also be aligned with the moving unit 300 according to necessity before fixing the substrate 400 to the moving unit 300.

In the substrate combining unit 220, the substrate 400 is disposed on the moving unit 300 in which a surface to which the substrate 400 is fixed faces upward (+Z direction). Next, a first inversion robot (not shown) in the substrate combining unit 220 inverts the moving unit 300. Thus, the surface of the moving unit 300, to which the substrate 400 is fixed, faces downward (-Z direction). However, the invention is not limited thereto, and the first inversion robot may not be needed. In an exemplary embodiment, as a conveyer unit 221 rotates about 180 degrees in the state in which the moving unit 300 is disposed on the conveyer unit 221 disposed in the substrate combining unit 220, the moving unit 300 disposed on the conveyer unit 221 may be flipped, for example. When the moving unit 300 is inverted in this manner, a surface of the substrate 400, which is opposite to a surface of the substrate 400 facing the moving unit 300, faces downward (-Z direction). Next, the conveyer unit 221 conveys the moving unit 300 including the substrate 400 fixed thereon to the first blocking member combining unit 230.

In exemplary embodiments, while the moving unit 300 is not inverted in the substrate combining unit 220, the conveyer unit 221 may convey the moving unit 300 including the substrate 400 fixed thereon to the first blocking member combining unit 230. In this case, the moving unit 300 may be inverted in the first blocking member combining unit 230.

The first blocking member combining unit 230 raises a first blocking member 500 from the bottom toward the +Z direction to combine the first blocking member 500 with the moving unit 300 including the substrate 400 fixed thereon, in the state in which the surface of the moving unit 300, to which the substrate 400 is fixed, faces downward (−Z direction). The first blocking member 500 exposes a portion of the substrate 400, on which deposition is to be performed.

Figure 2:
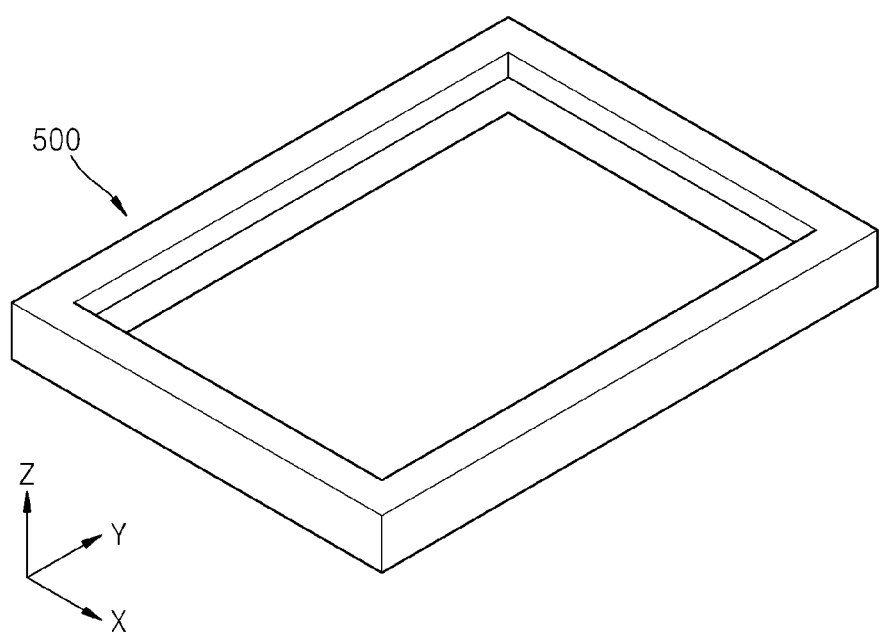
FIG. 2 is a schematic perspective view illustrating an exemplary embodiment of a first blocking member that is used when performing deposition by using the deposition apparatus illustrated in FIG. 1, according to the invention.

The first blocking member 500 may have, for example, a shape as illustrated in FIG. 2. In detail, the first blocking member 500 effectively prevents a material from being deposited in a non-layer forming area of the substrate 400. The non-layer forming area is a portion of an edge of the substrate 400, in which a driving circuit and the like is disposed. In the exemplary embodiment, the first blocking member 500 may have a shape such as a rectangular window frame, and may expose the whole surface of a display area of the substrate 400. However, the invention is not limited thereto and the first blocking member 500 may have various other shapes. In an exemplary embodiment, the moving unit 300 may include a clamp or the like, and the first blocking member 500 may be fixed to the moving unit 300 by the clamp or the like.

The first deposition unit 240 includes at least one deposition assembly for depositing a material on the substrate 400 in the state in which the first blocking member 500 is combined with the moving unit 300 including the substrate 400 fixed thereon. Although it is illustrated in FIG. 1 that the first deposition unit 240 includes four deposition assemblies 245, 246, 247 and 248, the number of the deposition assemblies may be changed according to a deposition material and a deposition condition. In an exemplary embodiment, the first deposition unit 240 may include a chamber 101 (FIG. 3) to be described below, and the chamber 101 may be maintained in a vacuum or near-vacuum state according to necessity while deposition is performed.

The first blocking member separation unit 250 separates the first blocking member 500 in the downward direction (−Z direction) from the moving unit 300 including the substrate 400 fixed thereon, in the state in which the surface of the moving unit 300, to which the substrate 400 is fixed, faces downward (−Z direction).

The substrate separation unit 260 separates the substrate 400 from the moving unit 300. The moving unit 300 that is conveyed to the substrate separation unit 260 is conveyed in the state in which the surface of the moving unit 300, to which the substrate 400 is fixed, faces downward (−Z direction). The substrate separation unit 260 may rotate the moving unit 300 so that the surface of the moving unit 300, to which the substrate 400 is fixed, faces upward (+Z direction), prior to the separation of the substrate 400. In an exemplary embodiment, a second inversion robot (not shown) may invert the moving unit 300. However, the invention is not limited thereto and the second inversion robot may not be needed. In an exemplary embodiment, as a conveyer 261 rotates about 180 degrees in the state in which the moving unit 300 is disposed on the conveyer unit 261 disposed in the substrate separation unit 260, the moving unit 300 disposed on the conveyer unit 261 may be flipped. When the moving unit 300 is inverted in this manner, a surface of the substrate 400, which is opposite to a surface of the substrate 400 facing the moving unit 300, faces upward (+Z direction). Next, the substrate separation unit 260 separates the substrate 400 from the moving unit 300. An ejection robot 294 loads the separated substrate 400′ into a second rack 292.

In exemplary embodiments, after separating the first blocking member 500 in the first blocking member separation unit 250, the moving unit 300 may be inverted in the first blocking member separation unit 250, and then may be conveyed to the substrate separation unit 260 in the state in which a surface of the substrate 400, which is opposite to a surface of the substrate 400 facing the moving unit 300, faces upward (+Z direction).

In the processing of the substrate 400, the moving unit 300 including the substrate fixed thereon is conveyed in a first direction (+Y direction) perpendicular to the upward direction. That is, the moving unit 300 including the substrate fixed thereon is sequentially conveyed to the substrate combining unit 220, the first blocking member combining unit 230, the first deposition unit 240, the first blocking member separation unit 250 and the substrate separation unit 260. A component that sequentially conveys the moving unit 300 including the substrate 400 fixed thereon to the substrate combining unit 220, the first blocking member combining unit 230, the first deposition unit 240, the first blocking member separation unit 250 and the substrate separation unit 260 may be referred to as a first conveyer unit. Such a first conveyer unit may include the conveyer 221 of the substrate combining unit 220, a conveyer unit (not shown) of the first blocking member combining unit 230, a conveyer unit 241 (refer to FIGS. 3 and 4) of the first deposition unit 240, a conveyer unit (not shown) of the first blocking member separation unit 250, and the conveyer unit 261 of the substrate separation unit 260. The first conveyer unit separates one or more of the deposition assemblies 245, 246, 247 and 248 from the substrate 400 by a predetermined distance so that a material is deposited on the substrate 400 while the moving unit 300 is conveyed in the first deposition unit 240, in the first direction (+Y direction).

When the substrate 400 is separated from the moving unit 300 in the substrate separation unit 260, the separated moving unit 300 is returned to the substrate combining unit 220 by a second conveyer unit 272 of the moving and returning unit 270. The returned conveyed moving unit 300 is combined with another substrate 400 in the substrate combining unit 220, and then is sequentially conveyed again to the first blocking member combining unit 230, the first deposition unit 240, the first blocking member separation unit 250 and the substrate separation unit 260 by the first conveyer unit. That is, the moving unit 300 may be circulated in the deposition apparatus by the first conveyer unit and the second conveyer unit 272.

In an exemplary embodiment, the second conveyer unit 272 may be disposed above the first conveyer unit as illustrated in FIG. 1. Due to the structure in which the moving unit 300, which allows a material to be deposited on the substrate 400 while being conveyed by the first conveyer unit, is separated from the substrate 400 in the substrate separation unit 260 and then is returned to the substrate combining unit 220 through the second conveyer unit 272 disposed on the first conveyer unit, an efficiency of space utilization may be improved. However, the invention is not limited thereto, and the second conveyer unit 272 may be disposed below the first conveyer unit unlike in the exemplary embodiment of FIG. 1.

The first blocking member 500 separated by the first blocking member separation unit 250 is returned to the first blocking member combining unit 230 by a first blocking member conveyer unit 284 of the first blocking member returning unit 280. The returned first blocking member 500 is combined with the moving unit 300 and another substrate 400 in the first blocking member combining unit 230, and then is sequentially conveyed again to the first deposition unit 240 and the first blocking member separation unit 250 by the first conveyer unit. That is, the first blocking member 500 may be circulated in the deposition apparatus by the first conveyer unit and the first blocking member conveyer unit 284.

In an exemplary embodiment, the first blocking member conveyer unit 284 may be disposed under the first conveyer unit as illustrated in FIG. 1. Through this configuration, deposition is performed on the substrate 400 while the first blocking member 500 is conveyed by the first conveyer unit, and the first blocking member 500 is separated from the substrate 400 in the first blocking member separation unit 250 and then is returned to the first blocking member combining unit 230 through the first blocking member conveyer unit 284 disposed under the first conveyer unit. Thus, the efficiency of space utilization may be improved. In another exemplary embodiment, the first blocking member conveyer unit 284 may be disposed on the first conveyer unit unlike the exemplary embodiment of FIG. 1.

Figure 3:
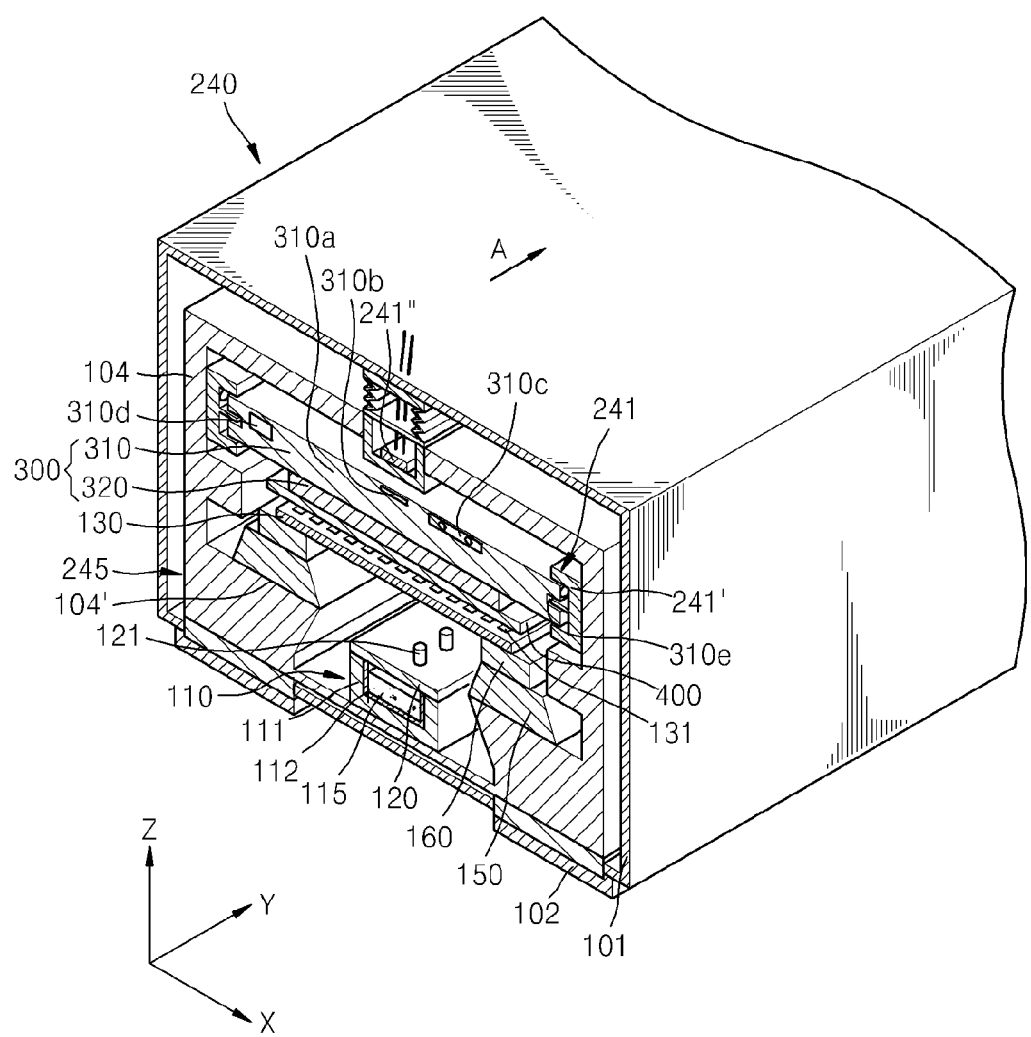
FIG. 3 is a schematic cross-sectional perspective view illustrating an exemplary embodiment of a portion of a first deposition unit of the deposition apparatus illustrated in FIG. 1 according to the invention.
Figure 4:
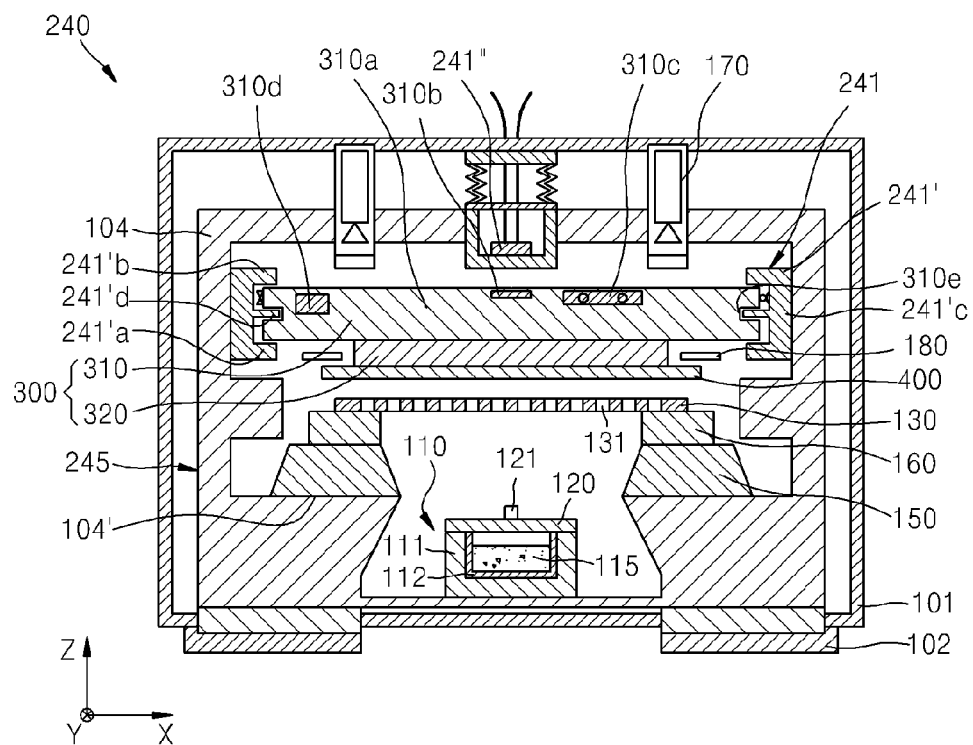
FIG. 4 is a schematic cross-sectional view illustrating an exemplary embodiment of a portion of the first deposition unit of the deposition apparatus illustrated in FIG. 1 according to the invention.

FIG. 3 is a schematic cross-sectional perspective view illustrating a portion of the first deposition unit 240 of the deposition apparatus illustrated in FIG. 1 according to an exemplary embodiment of the invention. FIG. 4 is a schematic cross-sectional view illustrating a portion of the first deposition unit 240 of the deposition apparatus illustrated in FIG. 1 according to an exemplary embodiment of the invention.

Referring to FIGS. 3 and 4, the first deposition unit 240 of the deposition apparatus includes the chamber 101 and the at least one deposition assembly 245.

In an exemplary embodiment, the chamber 101 may be provided as a hollow box type and accommodate the at least one deposition assembly 245. The conveyer unit 241 of the first deposition unit 240 that is a part of the first conveyer unit may also be accommodated in the chamber 101 as illustrated in FIGS. 3 and 4, or a portion of the conveyer unit 241 may be accommodated in the chamber 101 and another portion of the conveyer unit 241 may be disposed outside the chamber 101.

In the chamber 101, a housing 104 may be accommodated. In detail, the housing 104 may be disposed on a foot 102 which is fixable to a ground or a structure under the foot 102. In this regard, a connection part between the housing 104 and the chamber 101 is sealed so that the inside of the chamber 101 is completely isolated from the outside. Due to the structure in which the housing 104 is disposed on the foot 102 which is fixed to the ground or a structure under the foot 102, the housing 104 may be maintained in a fixed position even though the chamber 101 repeatedly contracts and expands. Thus, the housing 104 may serve as a reference frame in the first deposition unit 240.

The housing 104 may include the deposition assembly 245 and the conveyer unit 241 of the first deposition unit 240. While the moving unit 300 is cyclically conveyed between the second conveyer unit 272 and the first conveyer unit including the conveyer unit 241, deposition may be continuously performed on the substrate 400 fixed on the moving unit 300. Thus, the moving unit 300 which may be cyclically conveyed may include a carrier 310 and an electrostatic chuck 320 coupled thereto.

In an exemplary embodiment, the carrier 310 may include a main body part 310a, a linear motor system ("LMS") magnet 310b, contactless power supply ("CPS") modules 310c, a power supply unit 310d, and guide grooves 310e. The carrier 310 may further include cam followers according to necessity.

The main body part 310a provides a base part of the carrier 310 and may include a magnetic material such as iron. In this regard, due to an attractive force or a repulsive force between the main body part 310a of the carrier 310 and magnetically suspended bearings (not shown) disposed in the conveyer unit 241, the carrier 310 may be spaced apart from guide members 241' of the conveyer unit 241 by a certain distance. The guide grooves 310e may be provided at both sides of the main body part 310a. The guide grooves 310e may each accommodate a guide protrusion 241'd of the guide member 241' of the conveyer unit 241.

Furthermore, the main body part 310a may include a magnetic rail 310b (i.e., the LMS magnet 310b) arranged along a central line of a proceeding direction (Y-axis direction perpendicular to the X-axis and Z-axis directions). The magnetic rail 310b of the main body part 310a and the coil 241" may be combined with each other to provide a linear motor, and the carrier 310 included in the moving unit 300 may be transported in a direction A (+Y direction) by using the linear motor. Thus, the moving unit 300 may be conveyed according to a current applied to the coil 241" of the conveyer unit 241 without power being supplied to the moving unit 300. To this end, a plurality of coils 241" may be arranged at predetermined intervals in the chamber 101 (in the Y-axis direction). In this regard, as the coils 241" are disposed in an atmosphere box, the coils 241" may be installed in an atmospheric state.

The main body part 310a may include the CPS modules 310c that are disposed at one side and another side of the magnetic rail 310b. The power supply unit 310d includes a battery (e.g., a rechargeable battery) that provides power so that the electrostatic chuck 320 can chuck the substrate 400 and maintain the chucking. The CPS modules 310c are wireless charging modules that charge the power supply unit 310d. A charging of the battery via the CPS modules 310c will be described later.

In an exemplary embodiment, the electrostatic chuck 320 may include a main body including ceramic and an electrode embedded in the main body, wherein the electrode is supplied with power. The substrate 400 is attached onto a surface of the main body of the electrostatic chuck 320 as a high voltage is applied to the electrode embedded in the main body from the power supply unit 310d of the main body 310a of the carrier 310.

The conveyer unit 241 may convey the moving unit 300 including the above-described configuration and fixed with the substrate 400 thereon, in the first direction (+Y direction). The conveyer unit 241 includes the coils 241" and the guide members 241' as described above, and may further include a magnetically suspended bearing or a gap sensor or the like.

The coils 241" and the guide members 241' may be disposed inside the housing 104. In an exemplary embodiment, the coils 241" may be disposed in an upper portion of the housing 104, and the guide members 241' may be respectively disposed at both inner sides of the housing 104, for example.

As described above, the coils 241" may be combined with the magnetic rail 310b of the main body part 310a of the moving unit 300 to form a linear motor so as to move the moving unit 300. The guide members 241' may guide the moving unit 300 to be conveyed in the first direction (+Y direction) when the moving unit 300 moves. The guide members 241' may be disposed to pass through the first deposition unit 240.

In detail, the guide members 241' may accommodate both opposite sides of the carrier 310 of the moving unit 300 to guide the carrier 310 to move along in the direction A illustrated in FIG. 3. To this end, the guide members 241' may include a first accommodation part 241'$a$ disposed below the carrier 310, a second accommodation part 241'$b$ disposed above the carrier 310, and a connection part 241'$c$ that connects the first accommodation part 241'$a$ and the second accommodation part 241'$b$. An accommodation groove may be provided by the first accommodation part 241'$a$, the second accommodation part 241'$b$, and the connection part 241'$c$, and the guide members 241' may include a guide protrusion 241'$d$ in the accommodation groove.

The magnetically suspended bearings (not shown) are each disposed in the connection part 241'$c$ of the guide members 241' so as to respectively correspond to both sides of the carrier 310. The magnetically suspended bearings cause the carrier 310 and the guide members 241' to be separated by a certain distance so that the carrier 310 is moved along the guide members 241' without contacting the guide members 241'. In an exemplary embodiment, the magnetically suspended bearings may also be disposed on the second accommodation part 241'$b$ of the guide members 241' so as to be disposed on the carrier 310, and in this case, the magnetically suspended bearings may allow the carrier 310 to move along the guide members 241' without contacting the first accommodation part 241'$a$ or the second accommodation part 241'$b$ such that the carrier 310 is spaced apart from the first accommodation part 241'$a$ and the second accommodation part 241'$b$ by a predetermined distance. In an exemplary embodiment, in order to check a distance between the carrier 310 and the guide members 241', the guide members 241' may include a gap sensor (not shown) that is disposed at the first accommodation part 241'$a$ and/or the connection part 241'$c$ so as to correspond to a lower portion of the carrier 310. A magnetic force of the magnetically suspended bearings is modified according to a value measured by using the gap sensor, thereby adjusting the distance between the carrier 310 and the guide members 241' in real-time. That is, the carrier 310 may be precisely conveyed by feedback control by using the magnetically suspended bearings and the gap sensor.

While the conveyer unit 241 conveys the substrate 400 fixed on the moving unit 300 in the first direction (+Y direction), the deposition assembly 245 deposits a material on the substrate 400 while being spaced apart from the substrate 400 by a predetermined distance. Hereinafter, the deposition assembly 245 will be described in detail.

The first deposition assembly 245 includes the deposition source 110, a deposition source nozzle unit 120, the patterning slit sheet 130, a first stage 150, a second stage 160, a camera 170, a sensor 180, and the like. All the elements illustrated in FIGS. 3 and 4 may be arranged in the chamber 101 maintained in an appropriate vacuum state to achieve straight discharge of a deposition material.

The deposition source 110 may discharge a deposition material. The deposition source 110 may be disposed in a lower portion of the deposition assembly 245 and discharge a deposition material toward the substrate 400 (e.g., in an upward direction which is the +Z direction) as a deposition material 115 included in the deposition source 110 is sublimed or vaporized. In detail, the deposition source 110 includes a crucible 111 that is filled with the deposition material 115 and a heater 112 that heats the crucible 111 so as to vaporize the deposition material 115 filled in the crucible 111.

The deposition source nozzle unit 120 including a deposition source nozzle 121 is arranged in the upward direction (+Z direction) to the conveyer unit 241 of the deposition source 110, that is, in the direction toward the substrate 400. Referring to FIG. 3, the deposition source nozzle unit 120 includes a plurality of deposition source nozzles 121.

The patterning slit sheet 130 may be disposed to face the deposition source nozzle unit 120. In detail, a plurality of patterning slits extending in a direction in which the moving unit 300 is conveyed by the conveyer unit 241 may be defined in parallel in a direction (the X-axis direction) perpendicular to the first direction (+Y direction) in which the moving unit 300 is conveyed. The patterning slit sheet 130 is disposed between the deposition source 110 and the substrate 400. The deposition material 115 that is vaporized in the deposition source 110 passes through the deposition source nozzle units 120 and the patterning slit sheet 130 to be deposited on the substrate 400, which is a deposition object. In an exemplary embodiment, when a uniform deposition layer is to be disposed on the entire surface of the substrate 400, a single patterning slit instead of the plurality of patterning slits may be defined in the patterning slit sheet 130. In the exemplary embodiment, the single patterning slit may have the shape of an opening occupying the greater part of the patterning slit sheet 130.

The patterning slit sheet 130 may be provided using the same method as that used to form a fine metal mask ("FMM"), in particular, a stripe-type mask, e.g., etching. In this regard, the deposition source 110 (and the deposition source nozzle unit 120 combined thereto) and the patterning slit sheet 130 may be spaced apart from each other by a certain distance.

In order to deposit the deposition material 115 that has been discharged from the deposition source 110 and passed through the deposition source nozzle unit 120 and the patterning slit sheet 130 onto the substrate 400 in a desired pattern, it is desirable to maintain a chamber 101 in the same or similar high vacuum state as that used in a deposition method of an FMM. In addition, the temperature of the patterning slit sheet 130 should be sufficiently lower than that of the deposition source 110, i.e., about 100 degrees Celsius (° C.) or less, because thermal expansion of the patterning slit sheet 130 is minimized only when the temperature of the patterning slit sheet 130 is sufficiently low. That is, when the temperature of the patterning slit sheet 130 is increased, sizes or positions of patterning slits of the patterning slit sheet 130 may be de provided due to thermal expansion of the patterning slit sheet 130, and a different pattern from a previously set one may be deposited on the substrate 400.

The substrate 400, which is a deposition object, is arranged in the chamber 101. The substrate 400 may be a substrate for a flat panel display device. In an exemplary embodiment, a large substrate, such as a mother glass, for example, for manufacturing a plurality of flat panel displays, may be used as the substrate 400.

In a conventional deposition method using an FMM, the size of the FMM needs to be the same as that of a substrate. Thus, as the size of the substrate increases, the FMM also needs to be large in size. Due to these problems, it is difficult to fabricate the FMM, and due to self-gravity of the FMM, the FMM may droop and it is difficult to form an intermediate layer having a previously set and accurate pattern.

To address these problems, in the deposition apparatus according to the exemplary embodiment, deposition may be performed while the deposition assembly 245 and the substrate 400 are moved relative to each other. In detail, while the conveyer unit 241 conveys the substrate 400 fixed on the moving unit 300 in the first direction (+Y direction), the deposition assembly 245 that is spaced apart from the substrate 400 deposits a material on the substrate 400. That is, deposition is performed in a scanning manner while the substrate 400 is moved in the arrow direction A illustrated in FIG. 3. Although the substrate 400 is illustrated as being moved in the chamber 101 in the +Y direction when deposition is performed, exemplary embodiments of the invention are not limited thereto. In another exemplary embodiment, deposition may be performed while the substrate 400 is held in a fixed position and the deposition assembly 245 is moved in the −Y direction, for example.

Thus, in the deposition apparatus according to the current exemplary embodiment of the invention, the patterning slit sheet 130 may be much smaller than an FMM used in a conventional deposition method. In other words, in the deposition apparatus, deposition is continuously performed, i.e., in a scanning manner, while the substrate 400 is moved in the Y-axis direction. Thus, deposition may be sufficiently performed on most of the substrate 400 even when a length of the patterning slit sheet 130 in the Y-axis direction may be much less than a length of the substrate 400 in the Y-axis direction.

Since the patterning slit sheet 130 may be provided much smaller than the FMM used in a conventional deposition method, it is easy to manufacture the patterning slit sheet 130. That is, the small patterning slit sheet 130 is more advantageous in the manufacturing processes, including etching followed by precise elongation, welding, transferring, and washing processes, for example, than the FMM used in a conventional deposition method. In addition, this is more advantageous for manufacturing a relatively large display device.

As described above, the deposition assembly 245 deposits a material on the substrate 400 while being spaced apart from the substrate 400 when the conveyer unit 241 conveys the substrate 400 fixed on the moving unit 300 in the first direction (+Y direction). That is, the patterning slit sheet 130 is spaced apart from the substrate 400 by a predetermined distance. In a conventional deposition apparatus using an FMM, the FMM and a substrate are in contact, and thus, defects occur. However, according to the deposition apparatus of the current exemplary embodiment of the invention, these problems may be effectively prevented. In addition, since it is unnecessary to closely contact a substrate with a mask during a deposition process, a manufacturing speed may be significantly improved.

As illustrated in FIGS. 3 and 4, the housing 104 may include accommodation parts 104' disposed on both opposite sides of the deposition source 110 including the deposition source nozzle unit 120. The first stage 150 and the second stage 160 may be deposited on the accommodation parts 104', and a part of the patterning slit sheet 130 may be disposed on the second stage 160.

The first stage 150 may adjust a position of the patterning slit sheet 130 in the X-axis direction and the Y-axis direction. The first stage 150 may include a plurality of actuators to move the position of the patterning slit sheet 130 in the X-axis direction and the Y-axis direction with respect to the housing 104. The second stage 160 may adjust the position of the patterning slit sheet 130 in the Z-axis direction. In an exemplary embodiment, the second stage 160 may include an actuator to adjust the position of the patterning slit sheet 130 in the Z-axis direction with respect to the first stage 150, that is, with respect to the housing 104, for example.

By adjusting the position of the patterning slit sheet 130 with respect to the substrate 400 by using the first stage 150 and the second stage 160, an alignment, in particular, a real-time alignment, between the substrate 400 and the patterning slit sheet 130 may be performed.

In addition, the housing 104, the first stage 150 and the second stage 160 may guide a flow path of the deposition material such that the deposition material discharged through the deposition source nozzles 121 is not dispersed. That is, the path of the deposition material is limited by the housing 104, the first stage 150 and the second stage 160 such that the movement of the deposition material in the X-axis direction may be limited.

For an aligning process, the deposition assembly 245 may further include the camera 170 and the sensor 180. In an exemplary embodiment, the sensor 180 may be a confocal sensor. The camera 170 may generate data to be used in accurately aligning a first alignment mark (not shown) provided in the patterning slit sheet 130 and a second alignment mark (not shown) disposed on the substrate 400 in real time. The sensor 180 may generate data regarding a distance between the patterning slit sheet 130 and the substrate 400 so that the patterning slit sheet 130 and the substrate 400 are maintained at an appropriate distance from each other.

Since a distance between the substrate 400 and the patterning slit sheet 130 is measurable in real time by using the camera 170 and the sensor 180, the substrate 400 may be aligned with the patterning slit sheet 130 in real time, and thus position accuracy of a pattern may be significantly improved.

When deposition is performed in the first deposition unit 240, a deposition material is disposed not only on the substrate 400 fixed on the moving unit 300 but also on the first blocking member 500. The first blocking member 500 is repeatedly used when depositing a deposition material on a plurality of substrates 400. Thus, a large amount of deposition material is deposited also on the first blocking member 500, and thus, when the deposition material on the first blocking member 500 drops on the substrate 400 in the process of repeatedly using the first blocking member 500, a defect may occur due to the deposition material dropped on the substrate 400.

However, in the deposition apparatus according to the current exemplary embodiment, the first blocking member 500 moves in the upward direction (+Z direction) in a state in which the first blocking member 500 is disposed below the moving unit 300 in the first blocking member combining unit 230, and then is combined with the substrate 400 and the moving unit 300. Thus, although the deposition material on the first blocking member 500 is detached from the first blocking member 500, it does not move onto the substrate 400 but drops in the downward direction (−Z direction). Thus, the substrate 400 may be effectively prevented from being contaminated by the deposition material detached from the first blocking member 500.

In addition, when being separated from the moving unit 300 and the substrate 400 in the first blocking member separation unit 250, the first blocking member 500 is separated from the moving unit 300 and the substrate 400 while moving in the downward direction (−Z direction) of the moving unit 300. Thus, although the deposition material on the first blocking member 500 is detached from the first blocking member 500, it does not move onto the substrate 400 but drops in the downward direction (−Z direction). Thus, the substrate 400 may be effectively prevented from being contaminated by the deposition material detached from the first blocking member 500.

Furthermore, while the moving unit 300 is returned to the substrate combining unit 220 through the moving and returning unit 270 after being separated from the substrate 400 in the substrate separation unit 260, the first blocking member 500 is returned to the first blocking member combining unit 230 through the first blocking member returning unit 280 after being separated from the substrate 400 in the first blocking member separation unit 250. That is, a path through which the moving unit 300 is returned is different from that through which the first blocking member 500 is returned. Thus, by preventing the deposition material detached from the first blocking member 500 from being disposed on the moving unit 300, the substrate 400 may be effectively prevented from being contaminated by the detached deposition material.

Figure 5:
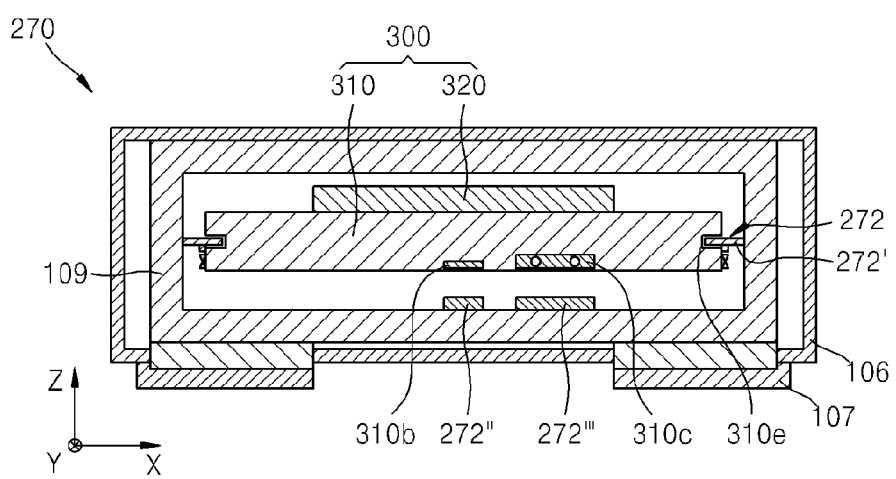
FIG. 5 is a schematic cross-sectional view illustrating an exemplary embodiment of a portion of a moving and returning unit of the deposition apparatus illustrated in FIG. 1 according to the invention.

FIG. 5 is a schematic cross-sectional view illustrating a portion of the moving and returning unit 270 of the deposition apparatus illustrated in FIG. 1 according to an exemplary embodiment of the invention. The moving and returning unit 270 may include a chamber 106 and a housing 109 accommodated in the chamber 106, similar to the first deposition unit 240. In detail, the housing 109 may be disposed on a foot 107 which is fixable to the ground or a structure under the foot 107. In this regard, a connection part between the housing 109 and the chamber 106 is sealed so that the inside of the chamber 106 is completely isolated from the outside. Due to the structure in which the housing 109 is disposed on the foot 107 which is fixed to the ground or a structure under the foot 107, the housing 109 may be maintained in a fixed position even though the chamber 106 repeatedly contracts and expands. Thus, the housing 109 may serve as a reference frame in the moving and returning unit 270.

In an exemplary embodiment, the inside of the moving and returning unit 270 may not be in a vacuum state unlike the deposition unit 240 in which deposition is performed. In this case, unlike the exemplary embodiment illustrated in FIG. 5, the chamber 106 and the housing 109 may be integrated or only one of them may be provided. The second conveyer unit 272 may be disposed in the housing 109.

The second conveyer unit 272 returns the moving unit 300, from which the substrate 400 has been separated in the substrate separation unit 260, to the substrate combining unit 220 after deposition is completed while the moving unit 300 passes through the first deposition unit 240. The second conveyer unit 272 includes a coil 272", roller guides 272', and a charging track 272''', which are disposed in the housing 109. In an exemplary embodiment, the coil 272" and the charging track 272''' may be disposed in a lower portion of the housing 109, and the roller guides 272' may be disposed on both inner sides of the housing 109. While not illustrated in the drawings, the coil 272" may also be disposed in an atmosphere box like the coil 241" of the conveyer unit 241.

Like the coil 241" of the conveyer unit 241, the coil 272" may be combined with the magnetic rail 310b of the carrier 310 of the moving unit 300 to form a linear motor. The linear motor allows the moving unit 300 to move in a direction (−Y direction) that is opposite to the first direction (+Y direction).

The roller guides 272' guide the carrier 310 to move in the direction (−Y direction) opposite to the first direction (+Y direction). The roller guides 272' support cam followers (not shown) respectively disposed on both sides of the carrier 310 of the moving unit 300 to guide the moving unit 300 to move in the direction (−Y direction) opposite to the first direction (+Y direction).

The second conveyer unit 272 performs the function of returning the moving unit 300 separated from the substrate 400 to the substrate combining unit 220, and thus, does not require high position accuracy of the moving unit 300 that is being conveyed, compared to the conveyer unit 241 that conveys the moving unit 300 on which the substrate 400 is fixed such that deposition is performed on the substrate 400. Therefore, magnetic suspension is applied to the conveyer unit 241 that requires high position accuracy of the moving unit 300 that is being conveyed, thereby achieving high position accuracy, and a conventional roller method may be applied to the second conveyer unit 272, thereby simplifying a structure of the deposition apparatus and reducing manufacturing costs. However, the invention is not limited thereto, and the magnetic suspension may be applied to the second conveyer unit 272 according to necessity as in the conveyer unit 241.

The charging track 272''' is connected to an inverter (not shown), and thus, when the second conveyer unit 272 conveys the carrier 310, a magnetic field is provided between the charging track 272''' and the CPS modules 310c so as to supply power to the CPS modules 310c, thereby charging the power supply unit 310d of the carrier 310.

As illustrated in FIG. 1, the substrate combining unit 220 may include an additional conveyer unit 222 other than the conveyer 221 that is a part of the first conveyer unit. The additional conveyer unit 222 may support the moving unit 300 when the moving unit 300, which is returned by the second conveyer unit 272, enters the substrate combining unit 220, and may be, for example, a pair of rails extending in the Y-axis direction. The pair of rails may widen an interval therebetween by moving in the +X direction and the −X direction, respectively, and then may allow the moving unit 300 to move in the downward direction (−Z direction) through the interval and to be disposed in the conveyer unit 221. To this end, a pin (not shown) supporting the moving unit 300 may move in an upward direction from the bottom to support the moving unit 300, and then may move to the bottom again to allow the moving unit 300 to be disposed in the conveyer unit 221. Then, the pair of rails may move so that the interval therebetween is narrowed again, and may support the moving unit 300 when the moving unit 300, which is returned by the second conveyer unit 272, enters the substrate combining unit 220.

In another exemplary embodiment, unlike the exemplary embodiment illustrated in FIG. 1, the substrate combining unit 220 may include only the conveyer unit 221. In this case, the conveyer unit 221 itself may move up and down. That is, when the moving unit 300, which is returned by the second conveyer unit 272, enters the substrate combining unit 220, the conveyer unit 221 may be disposed above the moving unit 300 to support the moving unit 300. Then, the conveyer unit 221 may move in the downward direction (−Z direction) in the state in which the moving unit 300 is supported thereby, and may convey the moving unit 300 to the first blocking member combining unit 230.

The substrate separation unit 260 may also include an additional conveyer unit 262 other than the conveyer 261 that is a part of the first conveyer unit, and in this case, the additional conveyer unit 262 may also be a pair of rails, an interval between which may vary. In another exemplary embodiment, the substrate separation unit 260 may include only the conveyer unit 261, and the conveyer unit 261 itself may move up and down.

In the first blocking member combining unit 230, a conveyer unit (not shown) that supports the moving unit 300 including the substrate 400 combined therewith and is a part of the first conveyer unit may be disposed in the upper portion of the first blocking member combining unit 230. In addition, in the first blocking member combining unit 230, an additional conveyer unit 234, which supports the first blocking member 500 returned by the first blocking member returning unit 280, other than the conveyer unit (not shown), may be disposed in the lower portion of the first blocking member combining unit 230. In a state in which the conveyed first blocking member 500 is supported by the additional conveyer unit 234, the first blocking member 500 may be moved in the upward direction (+Z direction) by a pin (not shown) such that the first blocking member 500 is combined with the moving unit 300 including the substrate 400 fixed thereon.

Also in the first blocking member separation unit 250, a conveyer unit (not shown) that supports the moving unit 300, with which the substrate 400 has been combined, and is a part of the first conveyer unit, may be disposed in the upper portion of the first blocking member separation unit 250. In addition, in the first blocking member separation unit 250, an additional conveyer unit 254, which supports the first blocking member 500 to be returned by the first blocking member returning unit 280, other than the conveyer unit (not shown), may be disposed in the lower portion of the first blocking member separation unit 250. When the first blocking member 500 is separated from the moving unit 300 including the substrate 400 fixed thereon, in a state in which a pin (not shown) has risen, the first blocking member 500 may be supported by the pin and may be supported on the lower additional conveyer unit 254 as the pin descends. And then, the additional conveyer unit 254 may convey the first blocking member 500 in the −Y direction such that the first blocking member 500 enters the first blocking member returning unit 280.

Although the first blocking member returning unit 280 is disposed below the first deposition unit 240 in the above exemplary embodiments, the exemplary embodiments of the invention are limited thereto. In an exemplary embodiment, in the case of a deposition apparatus according to another exemplary embodiment of the invention, the first blocking member returning unit 280 may be disposed next to the first deposition unit 240, i.e., next to the +X direction or next to the −X direction, for example. In this case, the first blocking member returning unit 284 returns the separated first blocking member 500 so that it passes by the first deposition unit 240.

In detail, the first blocking member separation unit 250 may include a first blocking member rotation unit that rotates the separated first blocking member 500 in a first rotation direction by a previously set angle by using the first direction (+Y direction) as an axis of rotation. In an exemplary embodiment, the first blocking member rotation unit may rotate the separated first blocking member 500 by about 90 degrees by using the first direction (+Y direction) as the axis of rotation. Specifically, referring to FIG. 2, since the first blocking member 500 is disposed on an XY plane, the first blocking member 500 is disposed on an YZ plane when the first blocking member rotation unit rotates the separated first blocking member 500 by about 90 degrees by using the first direction (+Y direction) as the axis of rotation. In the structure in which the first blocking member 500 is returned via a side of the first deposition unit 240 by rotating the first blocking member 500 as described above, a space under the first deposition unit 240 may be freely utilized, thereby facilitating the maintenance of the deposition apparatus. In addition, the entire height of the deposition apparatus in the +Z direction is effectively reduced, thereby facilitating the maintenance of the deposition apparatus.

In this case, the first blocking member combining unit 230 also includes a first blocking member rotation unit. The first blocking member rotation unit of the first blocking member combining unit 230 may rotate the first blocking member 500 returned by the first blocking member conveyer unit 284 in a second rotation direction, which is opposite to the first rotation direction, by a previously set angle (i.e., about 90 degrees) by using the first direction (+Y direction) as an axis of rotation, such that the first blocking member 500 is disposed on the XY plane again.

Figure 6:
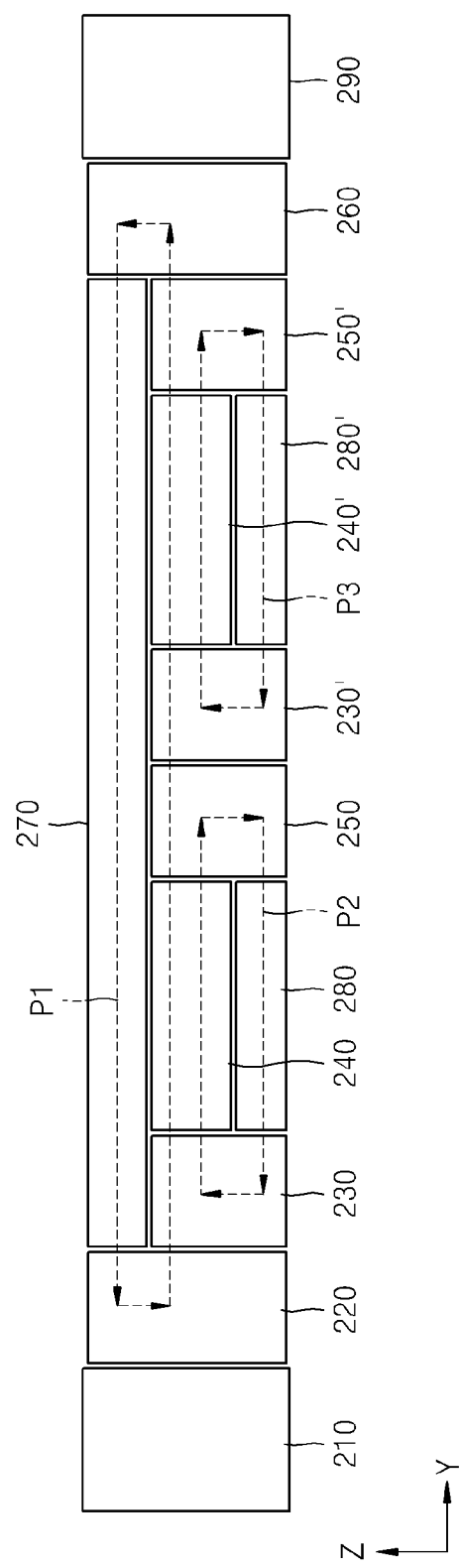
FIG. 6 is a schematic conceptual side view illustrating another exemplary embodiment of a deposition apparatus according to the invention.

FIG. 6 is a schematic conceptual side view illustrating a deposition apparatus according to another exemplary embodiment of the invention. As illustrated in FIG. 6, the deposition apparatus according to the current exemplary embodiment of the invention further includes a second blocking member combining unit 230', a second deposition unit 240' and a second blocking member separation unit 250' other than the components of the deposition apparatus illustrated in FIG. 1. The second blocking member combining unit 230', the second deposition unit 240' and the second blocking member separation unit 250' may be interposed between the first blocking member separation unit 250 and the substrate separation unit 260.

The second blocking member combining unit 230' raises a second blocking member from the bottom in the +Z direction such that the second blocking member is combined with the moving unit 300 including the substrate 400 fixed thereon. The surface of the moving unit 300, on which the substrate 400 is fixed, faces downward (−Z direction), and the second blocking member exposes a portion of the substrate 400, on which deposition is to be performed. The structure of the second blocking member combining unit 230' may be the same as or similar to that of the first blocking member combining unit 230 described above. The second deposition unit 240' includes one or more deposition assemblies for depositing a material on the substrate 400 in the state in which the second blocking member is combined with the moving unit 300 on which the substrate 400 has been fixed. The structure of the second deposition unit 240' may be the same as or similar to that of the first deposition unit 240 described above. The second blocking member separation unit 250' separates the second blocking member in the downward direction (−Z direction) from the moving unit 300 including the substrate 400 fixed thereon, in a state in which the surface of the moving unit 300, to which the substrate 400 is fixed, faces downward (−Z direction). The structure of the second blocking member separation unit 250' may be the same as or similar to that of the first blocking member separation unit 250 described above.

In the deposition apparatus according to the current exemplary embodiment, the first conveyer sequentially conveys the moving unit 300, on which the substrate 400 has been fixed, to the substrate combining unit 220, the first blocking member combining unit 230, the first deposition unit 240, the first blocking member separation unit 250, the second blocking member combining unit 230', the second deposition unit 240', the second blocking member separation unit 250', and the substrate separation unit 260. The moving unit 300 from which the substrate 400 has been separated is returned from the substrate separation unit 260 to the substrate combining unit 220 via the second conveyer unit 272 of the moving and returning unit 270. That is, the moving unit 300 is cyclically conveyed along a path P1 illustrated in FIG. 6 by the first conveyer unit and the second conveyer unit. The first blocking member 500 is cyclically conveyed along a path P2 illustrated in FIG. 6 by a portion of the first conveyer unit and the first blocking member conveyer unit 284 of the first blocking member returning unit 280. The second blocking member is cyclically conveyed along a path P3 illustrated in FIG. 6 by a portion of the first conveyer unit and a second blocking member conveyer unit of a second blocking member returning unit 280′. The second blocking member conveyer unit is disposed below the first conveyer unit, similar to the first blocking member conveyer unit. The structure of the second blocking member conveyer unit may be the same as or similar to that of the first blocking member conveyer unit.

In this manner, the moving unit 300, the first blocking member 500 and the second blocking member are cyclically conveyed, respectively, and are returned via different paths when they are returned. Thus, a material deposited on the first blocking member 500 and the second blocking member does not drop on the moving unit 300, thereby effectively preventing a defect from being caused on the substrate 400.

In addition, only one substrate combining unit 220 and only one substrate separation unit 260 are disposed in the deposition apparatus while using the first blocking member 500 and the second blocking member, and thus, the size of the deposition apparatus may be effectively reduced.

While the description has been focused on the deposition apparatus, the exemplary embodiments of the invention are not limited thereto. In an exemplary embodiment, a method of manufacturing an organic light emitting display apparatus by using the deposition apparatus is also included in the scope of the invention.

A method of manufacturing an organic light emitting display apparatus according to an exemplary embodiment of the invention includes placing the substrate 400 on the moving unit 300 in which a surface thereof, on which the substrate 400 is fixed, faces upward (+Z direction), and rotating the moving unit 300 including the substrate fixed thereon so that the surface, on which the substrate 400 is fixed, faces downward (−Z direction). Also, the method according to the exemplary embodiment of the invention includes raising the first blocking member 500 from the bottom in the +Z direction to combine the first blocking member 500 with the moving unit 300 including the substrate 400 fixed thereon, the moving unit 300 being in a state in which the surface on which the substrate 400 is fixed faces downward (−Z direction). The first blocking member 500 exposes a portion of the substrate on which deposition is to be performed, and covers a remaining portion of the substrate. The method according to the exemplary embodiment of the invention further includes providing a layer by depositing a deposition material discharged from the deposition assemblies 245, 246, 247, and 248 on the substrate 400 while relatively conveying the moving unit 300 including the substrate 400 fixed thereon, the moving unit 300 being combined with the first blocking member 500, with respect to the deposition assemblies 245, 246, 247, and 248 in a state in which in the first deposition unit 240, the deposition assemblies 245, 246, 247, and 248 and the substrate 400 are spaced apart from each other by a predetermined distance. The method according to the exemplary embodiment of the invention further includes separating the first blocking member 500 downward (−Z direction) from the moving unit 300 including the substrate 400 fixed thereon, the moving unit 400 being in a state in which the surface, on which the substrate is fixed, faces downward (−Z direction).

In the method according to the exemplary embodiment of the invention, the first blocking member 500 is always disposed under the substrate 400 and/or the moving unit 300. The first blocking member 500 rises from under the moving unit 300 toward the moving unit 300 when the first blocking member 500 is combined with the moving unit 300, and descends from the moving unit 300 downward when the first blocking member 500 is separated from the moving unit 300. Thus, a material dropped from the first blocking member 500 does not reach the substrate 400 and/or the moving unit 300. Thus, a manufacturing defect due to the material dropped from the first blocking member 300 may be effectively prevented.

The method according to the exemplary embodiment of the invention may further include separating the substrate 400 from the moving unit 300 including the substrate 400 fixed thereon after the separating of the first blocking member 500 and returning the moving unit 300 after the separating of the substrate 400 from the moving unit 300.

Thus, the moving unit 300 is cyclically conveyed, and thus, another substrate may be disposed on the moving unit 300 to reuse the moving unit 300. In addition, the method according to the exemplary embodiment of the invention may further include rotating the moving unit 300 including the substrate 400 fixed thereon so that the surface, on which the substrate 400 is fixed, faces upward (+Z direction), before the separating of the substrate 400 from the moving unit 300.

The returning of the moving unit 300 may include returning the moving unit 300 at a height that is greater than a height of conveying the moving unit 300 including the substrate 400 fixed thereon in the forming of the layer. That is, the second conveyer unit 272 that returns the moving unit 300 may be disposed on the first conveyer unit.

In addition, the first blocking member 500 as well as the moving unit 300 may also be reused. To this end, the method according to the exemplary embodiment of the invention may further include returning the separated first blocking member 500. The returning of the first blocking member 500 may include returning the first blocking member 500 at a height that is lower than the height of conveying the moving unit 300 including the substrate 400 fixed thereon in the forming of the layer. That is, the first blocking member conveyer unit 284 that returned the first blocking member 500 may be disposed under the first conveyer unit.

The method according to the exemplary embodiment of the invention may further include rotating the separated first blocking member 500, which is disposed on the XY plane, in a first rotation direction by a previously set angle (e.g., about 90 degrees) by using a first direction (+Y direction) as an axis of rotation. The returning of the first blocking member 500 may include returning the first blocking member 500 in a state in which the first blocking member 500 is rotated in the first rotation direction. In this case, the first blocking member 500 may be returned in a state in which the first blocking member 500 is disposed on the YZ plane. Thus, since the first blocking member 500 is returned via the side of the first deposition unit 240 rather than a space under the first deposition unit 240 where deposition is performed, the maintenance of the first deposition unit 240 may be more easier through the utilization of the space under the deposition unit 240.

A method of manufacturing an organic light emitting display apparatus according to another exemplary embodiment of the invention may further include raising a second blocking member from the bottom in the +Z direction to combine the second blocking member with the moving unit 300 including the substrate 400 fixed thereon after the separation of the first blocking member 500, the moving unit 300 being in a state in which the surface, on which the substrate 400 is fixed, faces downward (−Z direction). The second blocking member exposes a portion of the substrate 400 on which deposition is to be performed, and covers a remaining portion of the substrate 400. The method according to this other exemplary embodiment of the invention further includes forming a layer by depositing a deposition material discharged from a deposition assembly on the substrate 400 while relatively conveying the moving unit 300 including the substrate 400 fixed thereon, the moving unit 400 being combined with the second blocking member, with respect to the deposition assembly in a state in which in a second deposition unit, the deposition assembly and the substrate 400 are spaced apart from each other by a predetermined distance; and separating the second blocking member downward (−Z direction) from the moving unit 300 including the substrate 400 fixed thereon, the moving unit 300 being in a state in which the surface, on which the substrate 400 is fixed, faces downward (−Z direction). In addition, the method according to the other exemplary embodiment of the invention further include separating the substrate 400 from the moving unit 300 including the substrate 400 fixed thereon after the forming of the layer and the separating of the second blocking member.

Thus, in the method according to the other exemplary embodiments of the invention, the substrate 400 and the moving unit 300 are combined with each other one time and separated from each other one time, and in the interim, the first blocking member 500 and the second blocking member are sequentially combined with and separated from the moving unit 300 so that deposition may be performed. In addition, the first blocking member 500 and the second blocking member are always disposed under the substrate 400 and/or the moving unit 300. The first blocking member 500 and the second blocking member each rise from under the moving unit 300 toward the moving unit 300 when the first blocking member 500 and the second blocking member are each combined with the moving unit 300, and descend from the moving unit 300 downward when the first blocking member 500 and the second blocking member are each separated from the moving unit 300. Thus, a material dropped from the first blocking member 500 and/or the second blocking member does not reach the substrate 400 and/or the moving unit 300. Thus, a manufacturing defect due to the material dropped from the first blocking member 300 and/or the second blocking member may be effectively prevented. Thus, an organic light emitting display apparatus may be effectively manufactured by using the method according to any of the above-described exemplary embodiments of the invention.

Figure 7:
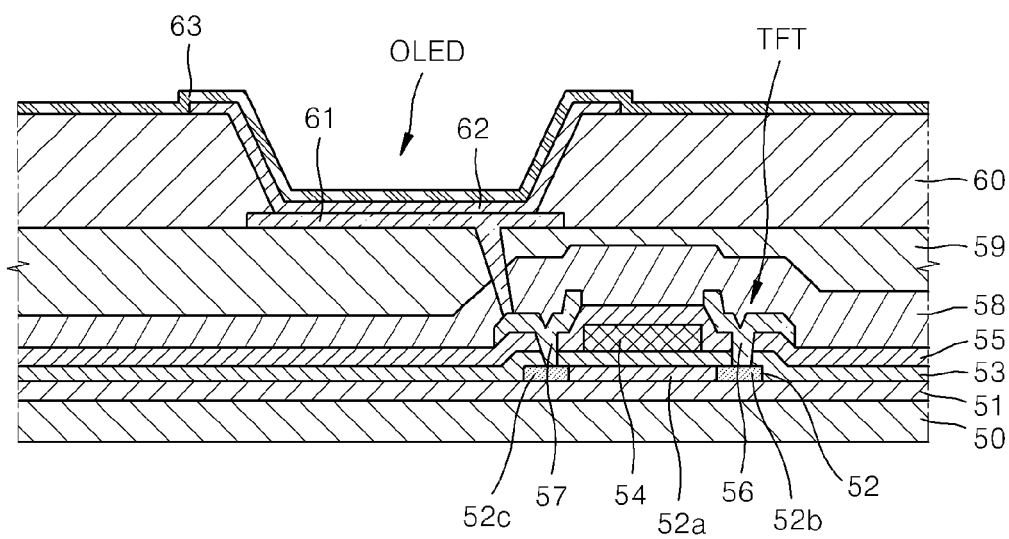
FIG. 7 is a schematic cross-sectional view illustrating an exemplary embodiment of an organic light-emitting display device manufactured using the deposition apparatus of FIG. 1 or FIG. 6, according to the invention.

FIG. 7 is a schematic cross-sectional view illustrating an organic light-emitting display device manufactured using the deposition apparatus, according to an exemplary embodiment of the invention.

Referring to FIG. 7, various elements of the organic light-emitting display device according to the current exemplary embodiment are disposed on a substrate 50. The substrate 50 may be the substrate 400 described above with reference to FIG. 3, for example, or a cut portion of the substrate 400. In an exemplary embodiment, the substrate 50 may include a transparent material such as glass, plastic, or metal.

Common layers such as a buffer layer 51, a gate insulating layer 53, and an interlayer insulating layer 55 may be disposed on the entire surface of the substrate 50. Also, a patterned semiconductor layer 52 including a channel area 52a, a source contact area 52b, and a drain contact area 52c may be disposed on the substrate 50, and also, a gate electrode 54, a source electrode 56, and a drain electrode 57 which are elements of a thin film transistor ("TFT") may be provided together with the patterned semiconductor layer.

In addition, a passivation layer 58 covering the TFT and a planarization layer 59 that is disposed on the passivation layer 58 and has an approximately planar upper surface may be disposed on the entire surface of the substrate 50. An organic light emitting device ("OLED") including a patterned pixel electrode 61, an opposite electrode 63 approximately corresponding to the entire surface of the substrate 50, and an intermediate layer 62 having a multi-layer structure that is interposed between the pixel electrode 61 and the opposite electrode 63 and includes an emissive layer may be disposed on the planarization layer 59. In another exemplary embodiment, differently from FIG. 7, the intermediate layer 62 may include a common layer that corresponds to a substantially entire surface of the substrate 50, and some of other layers may be patterned layers that are patterned to correspond to the pixel electrode 61. The pixel electrode 61 may be electrically connected to the TFT through a via hole. In another exemplary embodiment, a pixel defining layer 60 that covers an edge of the pixel electrode 61 and that an opening that corresponds to each pixel area is defined may be disposed on the planarization layer 59 so as to correspond to the substantially entire surface of the substrate 50.

At least some of elements of the organic light emitting display apparatus may be provided by using the deposition apparatus or the method of manufacturing the organic light emitting display apparatus according to the above-described exemplary embodiments of the invention.

In an exemplary embodiment, the intermediate layer 62 may be provided by using the deposition apparatus or the method of manufacturing an organic light emitting display apparatus according to the above-described exemplary embodiments of the invention. In an exemplary embodiment, a hole injection layer ("HIL"), a hole transport layer ("HTL"), an emission layer ("EML"), an electron transport layer ("ETL"), an electron injection layer ("EIL") and the like which may be included in the intermediate layer 62 may be provided by using the deposition apparatus or the method of manufacturing an organic light emitting display apparatus according to the above-described exemplary embodiments of the invention.

That is, when forming each of the layers of the intermediate layer 62, deposition may be performed while any one of a deposition assembly and a substrate for deposition moves relatively to the other, in a state in which the deposition assembly is disposed to be spaced apart by a predetermined distance from the substrate for deposition. The deposition assembly includes a deposition source, a deposition source nozzle unit, and a patterning slit sheet, and the substrate for deposition is a substrate with the pixel electrode 61 provided therein.

When the plurality of patterning slits 131 arranged in the X-axis direction is defined in the patterning slit sheet as illustrated in FIGS. 3 and 4, to form one layer of the intermediate layer 62 by using the patterning slit sheet, the layer may have a linear pattern. In an exemplary embodiment, the layer may be, for example, an EML.

In addition, when the deposition apparatus or the method of manufacturing an organic light emitting display apparatus according to the above-described exemplary embodiments of the invention is used, a material dropped from a blocking member may be effectively prevented from moving onto the substrate 50 or 400 by raising the blocking member to be combined with the substrate 50 or 400 before forming each layer of the intermediate layer 62 and making the blocking member separated from the substrate 50 or 400 descend downward when separating the blocking member.

As described above, when performing deposition on the large-surface substrate by using the deposition apparatus of FIG. 1 or the like, deposition may be performed accurately in a previously set area. Thus, even for an organic light emitting display apparatus including a substrate of a size of 40 inches or greater, an intermediate layer 62 may be accurately provided, thereby providing a high quality organic light emitting display apparatus.

As described above, according to the one or more of the above exemplary embodiments of the invention, a deposition apparatus capable of effectively preventing contamination in a deposition process, a method of manufacturing an organic light emitting display apparatus by using the deposition apparatus, and an organic light emitting display apparatus manufactured by using the method may be implemented.

It should be understood that the exemplary embodiments described herein should be considered in a descriptive sense only and not for purposes of limitation. Descriptions of features or exemplary embodiments within each exemplary embodiment should typically be considered as available for other similar features or exemplary embodiments in other exemplary embodiments.

While one or more exemplary embodiments of the invention have been described with reference to the figures, it will be understood by those of ordinary skill in the art that various changes in form and details may be made therein without departing from the spirit and scope of the invention as defined by the following claims.

What is claimed is:

1. A method of manufacturing an organic light emitting display apparatus, the method comprising:
   placing a substrate on a moving unit including a surface on which the substrate is fixed and which faces upward;
   flipping the moving unit including the substrate fixed thereon so that the surface on which the substrate is fixed, faces downward;
   raising a first blocking member to combine the first blocking member with the moving unit including the substrate fixed thereon, the moving unit being in a state in which the surface on which the substrate is fixed, faces downward, so that the first blocking member exposes a whole surface, except for a non-layer forming area, of the subtrate;
   forming a layer by depositing a deposition material discharged from a deposition assembly on the substrate while relatively conveying the moving unit including the substrate fixed thereon in a first direction with respect to the deposition assembly in a state in which the deposition assembly including a mask having a plurality of patterning slits for selective deposition in a direction perpendicular to the first direction and the substrate are spaced apart from each other by a predetermined distance;
   separating the first blocking member downward from the moving unit including the substrate fixed thereon, the moving unit being in the state in which the surface, on which the substrate is fixed, faces downward;
   separating the substrate from the moving unit; and
   returning the separated first blocking member at a height which is lower than a height of conveying the moving unit including the substrate fixed thereon in the forming the layer such that the separated first blocking member is returned under the deposition assembly including the mask, in order to recombine the separated first blocking member with the moving unit including a new substrate fixed thereon.

2. The method of claim 1, further comprising flipping the moving unit including the substrate fixed thereon so that the surface on which the substrate is fixed, faces upward, before the separating the substrate from the moving unit.

3. The method of claim 1, further comprising returning the moving unit to dispose a new substrate on the moving unit after the separating the substrate from the moving unit.

4. The method of claim 3, wherein the returning the moving unit comprises returning the moving unit at a height which is greater than a height of conveying the moving unit including the substrate fixed thereon in the forming the layer.

5. The method of claim 1, further comprising:
   raising a second blocking member to combine the second blocking member with the moving unit including the substrate fixed thereon, the moving unit being in the state in which the surface, on which the substrate is fixed, faces downward, so that the second blocking member exposes a portion of the substrate on which deposition is to be performed;
   forming a layer by depositing a deposition material discharged from a deposition assembly on the substrate while relatively conveying the moving unit including the substrate fixed thereon in a first direction with respect to the deposition assembly in the state in which the deposition assembly and the substrate are spaced apart from each other by a predetermined distance; and
   separating the second blocking member downward from the moving unit including the substrate fixed thereon, the moving unit being in the state in which the surface, on which the substrate is fixed, faces downward.

6. The method of claim 5, further comprising separating the substrate from the moving unit including the substrate fixed thereon after the separating the second blocking member.

7. The method of claim 6, further comprising flipping the moving unit including the substrate fixed thereon so that the surface, on which the substrate is fixed, faces upward, before the separating the substrate from the moving unit.

8. The method of claim 6, further comprising returning the moving unit to dispose a new substrate on the moving unit after the separating the substrate from the moving unit.

9. The method of claim 8, wherein the returning the moving unit comprises returning the moving unit at a height which is greater than a height of conveying the moving unit including the substrate fixed thereon in the forming the layer.

10. The method of claim 6, further comprising:
    returning the separated second blocking member to recombine the separated second blocking member with the moving unit including a new substrate fixed thereon.

11. The method of claim 10, wherein the returning the second blocking member comprises returning the second blocking member at a height which is lower than the height of conveying the moving unit including the substrate fixed thereon in the forming the layer such that the separated second blocking member is returned under the deposition assembly.

* * * * *